(12) United States Patent
Tian

(10) Patent No.: US 11,862,064 B2
(45) Date of Patent: Jan. 2, 2024

(54) ARRAY SUBSTRATE AND DISPLAY PANEL WITH GATE DRIVER ON ARRAY CIRCUIT IN DISPLAY AREA

(71) Applicant: Wuhan China Star Optoelectronics Technology Co., Ltd., Hubei (CN)

(72) Inventor: Chao Tian, Hubei (CN)

(73) Assignee: Wuhan China Star Optoelectronics Technology Co., Ltd., Wuhan (CN)

( * ) Notice: Subject to any disclaimer, the term of this patent is extended or adjusted under 35 U.S.C. 154(b) by 665 days.

(21) Appl. No.: 16/970,636

(22) PCT Filed: Jun. 15, 2020

(86) PCT No.: PCT/CN2020/096214
§ 371 (c)(1),
(2) Date: Aug. 18, 2020

(87) PCT Pub. No.: WO2021/217813
PCT Pub. Date: Nov. 4, 2021

(65) Prior Publication Data
US 2023/0114530 A1 Apr. 13, 2023

(30) Foreign Application Priority Data
Apr. 27, 2020 (CN) .......................... 202010346435.7

(51) Int. Cl.
*G09G 3/20* (2006.01)

(52) U.S. Cl.
CPC ... *G09G 3/2096* (2013.01); *G09G 2300/0408* (2013.01); *G09G 2300/0426* (2013.01); *G09G 2300/0876* (2013.01); *G09G 2310/08* (2013.01)

(58) Field of Classification Search
CPC ......... G09G 3/2096; G09G 2300/0408; G09G 2300/0426; G09G 2300/0876; G09G 2310/08
See application file for complete search history.

(56) References Cited

U.S. PATENT DOCUMENTS

| 9,928,795 B2* | 3/2018 | Gong | ........................ G09G 3/36 |
| 10,269,320 B1* | 4/2019 | Gong | ..................... G11C 19/28 |
| 10,453,405 B2 | 10/2019 | Li | |
| 2016/0329021 A1 | 11/2016 | Nagayama et al. | |
| 2019/0096306 A1* | 3/2019 | Kong | ..................... G11C 19/28 |

FOREIGN PATENT DOCUMENTS

| CN | 104485085 | 4/2015 |
| CN | 104536229 | 4/2015 |
| CN | 105575318 | 5/2016 |
| CN | 106023944 | 10/2016 |
| CN | 110211527 | 9/2019 |
| CN | 110265454 | 9/2019 |
| CN | 111505852 | 8/2020 |
| KR | 10-2008-0062264 | 7/2008 |
| KR | 10-2009-0072548 | 7/2009 |

* cited by examiner

*Primary Examiner* — Kwang-Su Yang

(57) ABSTRACT

An array substrate and a display panel are disclosed; at least one GOA circuit is provided in a pixel area of a same row, all GOA circuits of the same row are connected to a same scan line, and each GOA circuit of the same row is connected to a driving IC through a corresponding driving signal line. By setting the GOA circuit in a display area, a near bezel-free display panel design can be realized. Meanwhile, the GOA circuit is modularly designed to form an independent layout model, which improves design efficiency.

18 Claims, 5 Drawing Sheets

|   | INPUT TERMINAL | INTERMEDIATE NODE | OUTPUT TERMINAL |
|---|---|---|---|
| G | ✻ | ✻ | ✻ |
| D | ✻ | ✻ | ✻ |
| S | ✻ | ✻ | ✻ |

ARRAY SUBSTRATE AND DISPLAY PANEL WITH GATE DRIVER ON ARRAY CIRCUIT IN DISPLAY AREA

RELATED APPLICATIONS

This application is a National Phase of PCT Patent Application No. PCT/CN2020/096214 having International filing date of Jun. 15, 2020, which claims the benefit of priority of Chinese Patent Application No. 202010346435.7 filed on Apr. 27, 2020. The contents of the above applications are all incorporated by reference as if fully set forth herein in their entirety.

FIELD AND BACKGROUND OF THE INVENTION

The present disclosure relates to the field of display technology, in particular to an array substrate and a display panel.

Currently, liquid crystal display devices (LCDs) have been widely used in various electronic products as display components of electronic equipment. Thin film transistors (TFTs) are important parts of LCDs due to their superior characteristics such as high space utilization efficiency, low power consumption, non-radioactivity, and low electromagnetic interference. As people's demand for ultra-narrow bezel displays intensify, the development boom of gate driver on array (GOA) technique has begun.

GOA technique is a technology that fabricates gate row scan driving circuits on array substrates using the existing TFT array substrate manufacturing process to scan the gates line by line. The current GOA circuits are mainly designed on two sides of the display panels and eliminate bonding processes in a direction of the row scan lines, thereby improving the integration of the display panels and making it more suitable for making narrow bezel display products.

With rising demand for increasingly narrower display panel bezels, the display panels need to continuously reduce bezel sizes. For example, full-screen mobile phones have increasingly higher requirements for display panel bezels. Meanwhile, in face of applications such as in-vehicle applications, the outer shape of the display panels become more diverse and complex.

In current GOA circuit designs, the GOA circuits placed on both sides of the display panels occupy a certain layout space, which affects a requirement of extreme narrow bezels. When the widths of the layout space occupied by the GOA circuits cannot be compressed, the size of display panel bezels can no longer be decreased.

SUMMARY OF THE INVENTION

Embodiments of the present disclosure provide an array substrate and a display panel, which can achieve a display panel design close to bezel-less and improve product competitiveness.

An embodiment of the present disclosure provides an array substrate. The array substrate includes a display area and comprises a plurality of scan lines extending in a horizontal direction and a plurality of data lines extending in a vertical direction; the scan lines and the data lines intersect as an array to define a plurality of pixel areas in the display area, wherein each pixel area is provided with a pixel unit; at least one gate driver on array (GOA) circuit is arranged in the pixel areas of a same row, wherein all GOA circuits in the same row are connected to the same scan line, and each GOA circuit in the same row is connected to a driving IC through corresponding driving signal lines extending in the vertical direction to receive a GOA driving signal; in the pixel areas in two adjacent rows, the GOA circuit in the pixel area of the first row and the GOA circuit in the pixel area of the second row are staggered by at least one pixel unit in the horizontal direction; and the GOA circuit comprises a plurality of thin film transistors, wherein independent layout models are formed according to connection states of three electrodes of the thin film transistors, so that a layout of the GOA circuit is a sequential combination of layout models of corresponding thin film transistors.

An embodiment of the present disclosure provides an array substrate. The array substrate includes a display area and comprises a plurality of scan lines extending in a horizontal direction and a plurality of data lines extending in a vertical direction; the scan lines and the data lines intersect as an array to define a plurality of pixel areas in the display area, wherein each pixel area is provided with a pixel unit; and at least one gate driver on array (GOA) circuit is arranged in the pixel areas of a same row, wherein all GOA circuits in the same row are connected to the same scan line, and each GOA circuit in the same row is connected to a driving IC through corresponding driving signal lines extending in the vertical direction to receive a GOA driving signal.

An embodiment of the present disclosure further provides a display panel including an array substrate, and the array substrate comprises a display area and comprises a plurality of scan lines extending in a horizontal direction and a plurality of data lines extending in a vertical direction; the scan lines and the data lines intersect as an array to define a plurality of pixel areas in the display area, wherein each pixel area is provided with a pixel unit; at least one gate driver on array (GOA) circuit is arranged in the pixel areas of a same row, wherein all GOA circuit in the same row is connected to a driving IC through corresponding physical driving signal lines extending in the vertical direction to receive a GOA driving signal.

The array substrate of the present disclosure can realize the design of a display panel close to bezel-less and improve the product competitiveness by designing the GOA circuit in the display area. Meanwhile, the GOA circuit is modularly designed, and according to the connection states of the three electrodes of the thin film transistors in the GOA circuit, the TFT types can be divided into modules to form independent layout models, and thus the layout of the GOA circuit becomes a sequential combination of layout models of corresponding TFTs and improves the design efficiency.

BRIEF DESCRIPTION OF THE SEVERAL VIEWS OF THE DRAWINGS

In order to more clearly explain the technical solutions in the embodiments of the present disclosure, the following will briefly introduce the drawings required in the description of the embodiments. Obviously, the drawings in the following description are only some embodiments of the present disclosure. For those skilled in the art, without paying any creative work, other drawings can be obtained based on these drawings.

DESCRIPTION OF SPECIFIC EMBODIMENTS OF THE INVENTION

Figure 1:
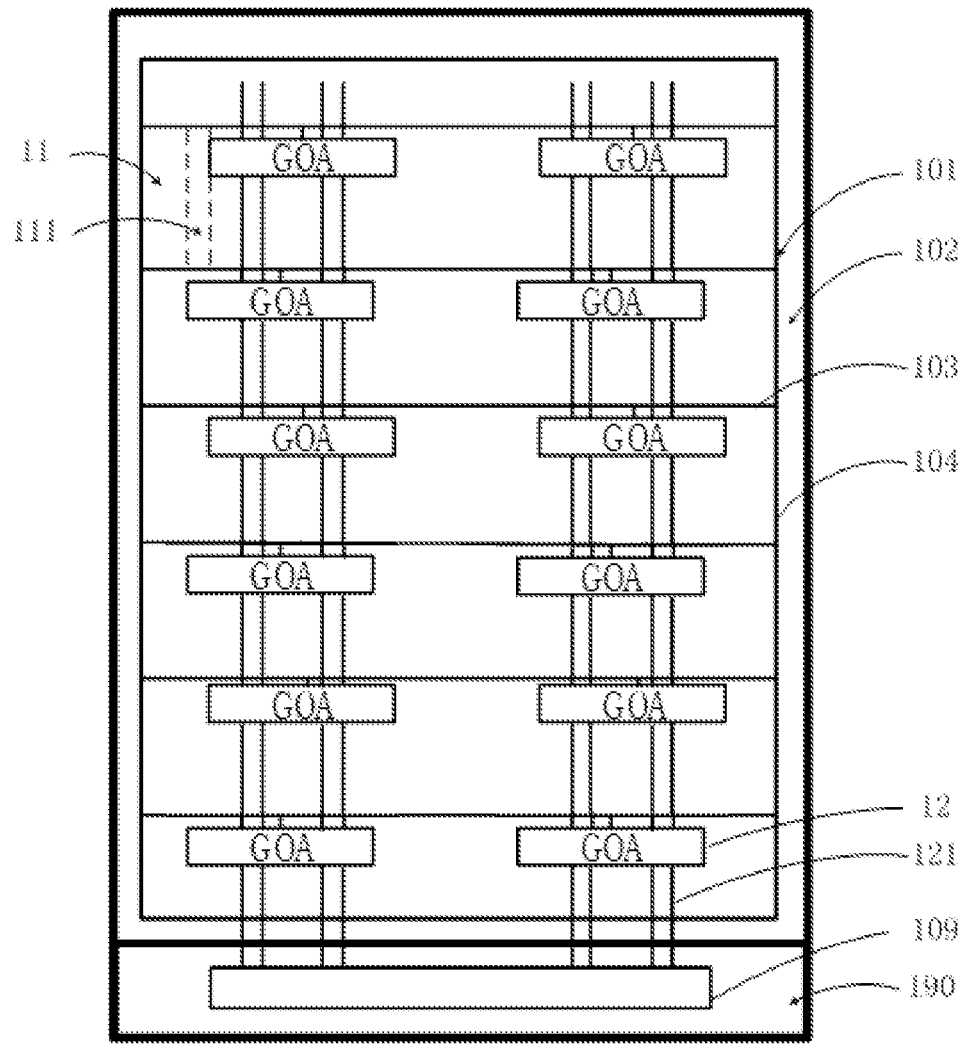
FIG. 1 is a schematic structural diagram of an embodiment of an array substrate of the present disclosure.

The embodiments of the present disclosure are described in detail below. Examples of the embodiments are shown in the drawings, in which the same or similar reference numerals indicate the same or similar components or components having the same or similar functions. The terms "first", "second", "third", etc. (if any) in the description and claims of the present disclosure and the drawings are used to distinguish similar objects, and do not have to be used to describe a specific order or sequence. It should be understood that the objects so described are interchangeable under appropriate circumstances. In the description of the present disclosure, the meaning of "plurality" is two or more, unless otherwise specifically defined. In addition, the terms "including" and "having" and any variations thereof are intended to cover non-exclusive inclusions. Directional terms mentioned in the present disclosure, such as, up, down, left, right, front, back, inside, outside, side, etc., are only directions with reference to the drawings.

In the description of the present disclosure, it should be noted that the terms "installation", "connection" and "coupling" should be understood in a broad sense, unless otherwise clearly specified and defined. For example, it can be a fixed connection, a detachable connection, or integrated connection; it can be a mechanical connection, an electrical connection or can communicate with each other; it can be directly connected or indirectly connected through an intermediary, it can also be the connection between two elements or the interaction between two elements. Those ordinary skilled in the art can understand the specific meanings of the above terms in the present disclosure according to specific situations.

The present disclosure proposes an array substrate. A GOA circuit is designed in a display area (AA), which can realize a near bezel-free display panel design to improve product competitiveness. Meanwhile, the GOA circuit is modularly designed. According to connection states of three electrodes of thin film transistors (TFTs) in the GOA circuit, the TFT types can be divided into modules to form an independent layout model, and a layout of the GOA circuit becomes a sequence combination of layout models of the corresponding TFTs and thus improves design efficiency.

Please refer to FIG. 1, which is a schematic structural diagram of an embodiment of an array substrate of the present disclosure. The array substrate includes a display area 101 and a non-display area 102 surrounding the display area 101. The array substrate has a plurality of scan lines 103 extending in a horizontal direction (the row direction) and a plurality of data lines 104 extending in a vertical direction (the column direction). The scan lines 103 and the data lines 104 intersect as an array. A plurality of pixel areas 11 are defined in the display area 101, and each pixel area 11 is provided with a pixel unit 111. At least one gate driver on array (GOA) circuit is arranged in the pixel areas 11 of a same row. All GOA circuits 12 in the same row are connected to the same scan line 103 for driving the scan line 103 in the same row. Each GOA circuit 12 is connected to a driving IC 109 through corresponding driving signal lines 121 to receive a GOA driving signal. Wherein, the driving signal lines 121 extend in the vertical direction, which is same as an extending direction of the data lines 104. The driving IC 109 may be disposed at an outer lead bonding area (OLB) 190 of the display panel where the array substrate is located.

In the present embodiment, the GOA driving signal provided by the driving IC 109 is input to the GOA circuit 12 along the vertical direction, and in the same row, two GOA circuits 12 are provided to drive a single row scan line to improve GOA driving ability, and reduce the signal delay of the scan line and prevent the signal from being output incorrectly. It should be noted that, in the same row, one or more than two GOA circuits can be set, and the design can be made according to the GOA driving capability requirements and panel layout space limitations.

In a further embodiment, the GOA circuit 12 is located at a gap between the pixel units 111 in two adjacent rows. That is, the setting of the GOA circuit reduces the occupation of the area for displaying images, and reduces the influence on the aperture ratio of the pixel.

In a further embodiment, the GOA circuit 12 includes a plurality of thin film transistors to drive the corresponding scan lines in response to the GOA driving signals.

In a further embodiment, in the pixel areas 11 of two adjacent rows, the GOA circuit 12 in the pixel area 11 of the first row and the GOA circuit 12 in the pixel area 11 of the second row are staggered by at least one pixel unit 111. That is, the GOA circuits in odd and even rows are staggered, so that the arrangement positions of the signal lines transmitting the opposite driving signals to the GOA circuits of odd and even rows are staggered, therefore only one data line and one driving signal line are provided between the pixel units 111 for two adjacent rows; without needing to set up data lines and two signal lines transmitting opposite driving signals simultaneously, this reduces the number of wires and improves layout utilization efficiency.

In the present embodiment, by setting the GOA circuit in the display area, an ultra-narrow bezel display panel design can be realized. The GOA driving signal is provided through the driving IC, and multiple GOA circuits can be used to drive a single row scan line, which improves GOA driving capability. By setting the GOA circuit at the gap between pixel units in two adjacent rows, the influence on the aperture ratio of the pixel is reduced. The GOA circuits in odd and even rows are staggered, thus reducing the number of wires and improving layout utilization efficiency.

Figure 2:
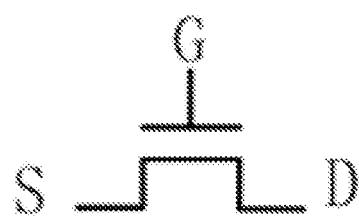
FIG. 2 is the connection scheme of the layout model of the present disclosure.
Figure 3:
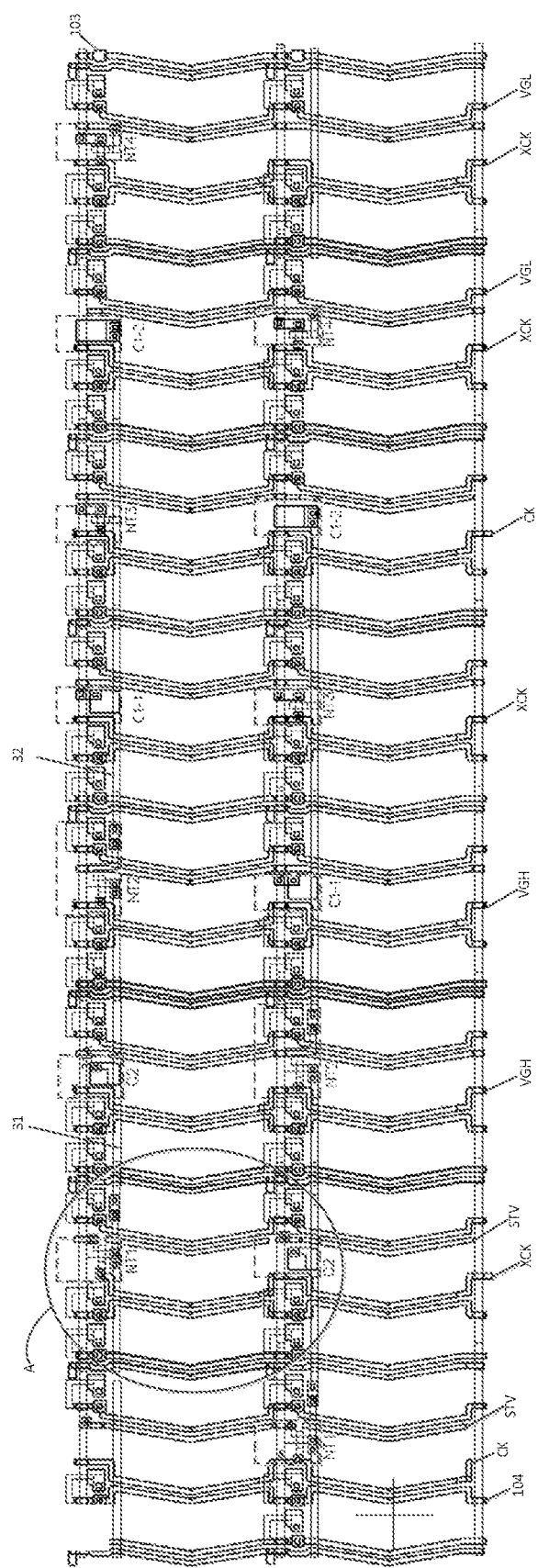
FIG. 3 is a schematic diagram of a layout of an embodiment of an array substrate of the present disclosure.
Figure 4:
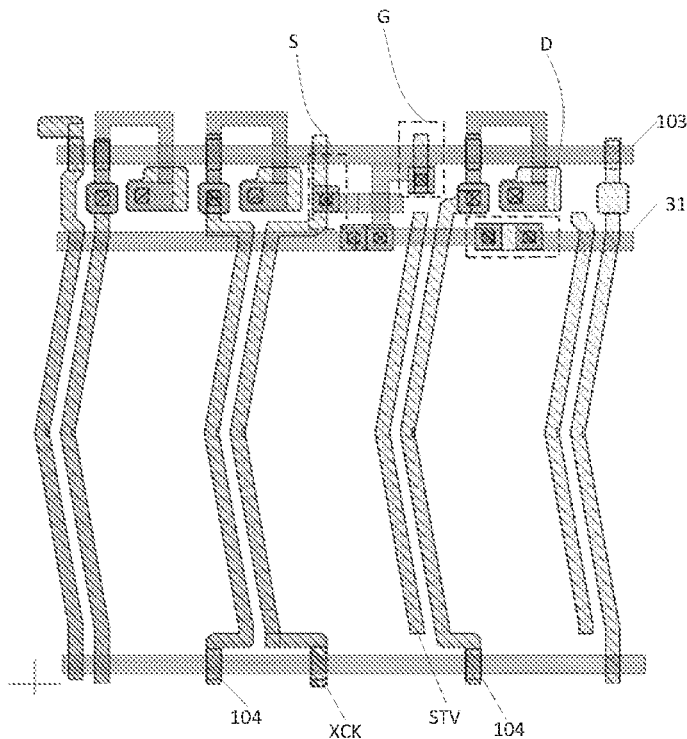
FIG. 4 is an enlarged schematic diagram of part A in FIG. 3.
Figure 5:
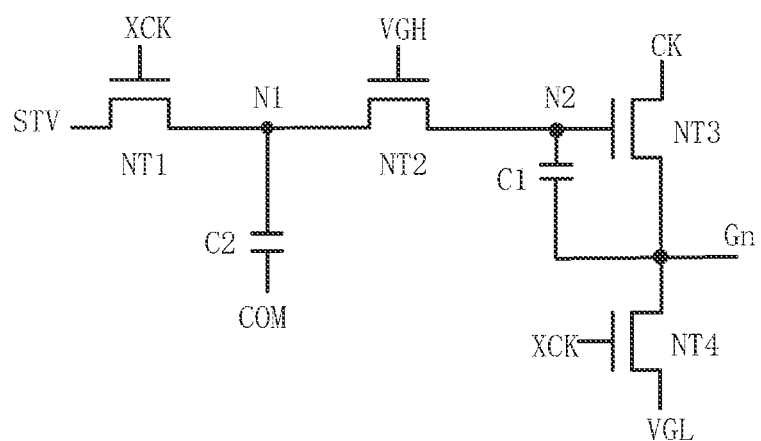
FIG. 5 is an equivalent circuit diagram of the GOA circuit in FIG. 3.
Figure 6:
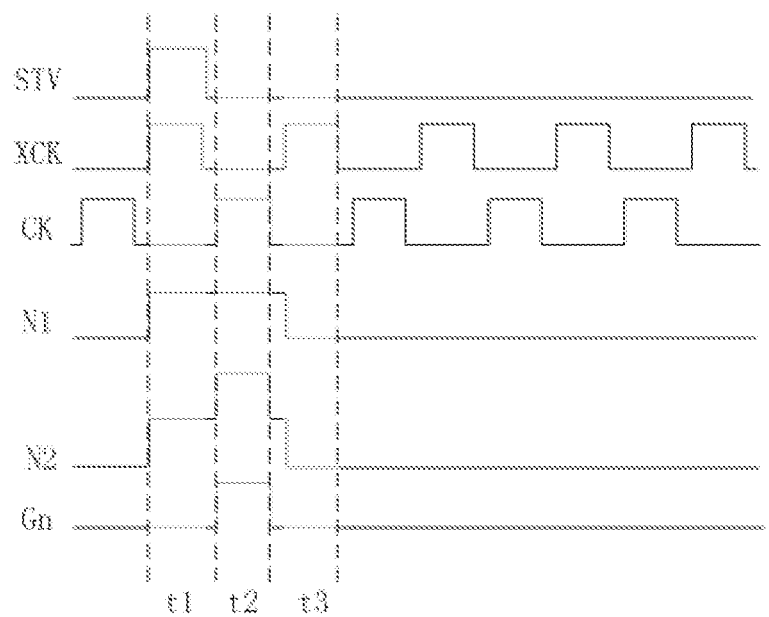
FIG. 6 is a driving timing diagram of the GOA circuit shown in FIG. 5.

Please refer to FIG. 2 to FIG. 6 together. FIG. 2 is a connection scheme of the layout model of the present disclosure. FIG. 3 is a schematic diagram of the layout of an embodiment of the array substrate of the present disclosure. FIG. 4 is an enlarged schematic diagram of part A in FIG. 3. FIG. 5 is an equivalent circuit diagram of the GOA circuit in FIG. 3, and FIG. 6 is a driving timing diagram of the GOA circuit shown in FIG. 5.

As shown in FIG. 2, the connection states of each of the three electrodes (the gate electrode G, the source electrode S, and the drain electrode D of the thin film transistor) can be divided into three types: an input terminal, an intermediate node, and an output terminal. The intermediate node is a node where the thin film transistor is connected to other thin film transistors in the same GOA circuit. Except for the connection states where the three electrodes are connected to the input terminal or the output terminal simultaneously, a corresponding independent layout model can be established according to the remaining connection states, such as, a layout model in which the gate G and the source S both serve as the input terminals, and the drain D serves as the intermediate node; a layout model in which the gate G serves as the input terminal, and the source S and the drain D both serve as the intermediate nodes; a layout model in which the gate G serves as the intermediate node, the source S serves as the input terminal, and the drain D serves as the output terminal; and a layout model in which the gate G and the source S both serve as the input terminals, and the drain D serves as the output terminal.

By separately designing an independent layout model for each connection state, the layout of the GOA circuit is designed as a sequential combination of layout models of corresponding thin film transistors. The layout model can cover all the structures in general circuits, so that the layout design of the GOA circuit can be completed through the sequential combination of the layout models, and the design efficiency is improved.

In a further embodiment, an electrode used as the input terminal is connected to the corresponding driving signal line, an electrode used as the output terminal is connected to the corresponding scan line, and an electrode used as the intermediate node is connected to a corresponding GOA internal wire, wherein the GOA internal wire is extended along the horizontal direction.

As shown in FIG. 3, in the present embodiment, the GOA circuit 12 includes four thin film transistors (NT1-NT4) and a capacitor C1, and the four thin film transistors are sequentially arranged in the horizontal direction. The driving signal lines 121 include first clock signal lines XCK, an initialization signal line STV, a first level signal line VGH, a second clock signal line CK and a second level signal line VGL.

Specifically, a layout model of the first thin film transistor NT1 (indicated by a dashed frame) is that, a gate of the first thin film transistor NT1 serves as the input terminal and is connected to one of the first clock signal lines XCK, a first electrode of the first thin film transistor NT1 serves as the input terminal and is connected to the initialization signal line STV, and a second electrode of the first thin film transistor NT1 serves as the intermediate node and is connected to a first GOA internal wire 31. An enlarged schematic diagram is shown in FIG. 4.

Specifically, a layout model of the second thin film transistor NT2 is that, a gate of the second thin film transistor NT2 serves as the input terminal and is connected to the first level signal line VGH, a first electrode of the second thin film transistor NT2 serves as the intermediate node and is connected to the first GOA internal wire 31, and a second electrode of the second thin film transistor NT2 serves as the intermediate node and is connected to a second GOA internal wire 32.

Specifically, a layout model of the third thin film transistor NT3 is that, a gate of the third thin film transistor NT3 serves as the intermediate node and is connected to the second GOA internal wire 32, a first electrode of the third thin film transistor NT3 serves as the input terminal and is connected to the second clock signal line CK, and a second electrode of the third thin film transistor NT3 serves as the output terminal and is connected to a scan line 103 corresponding to a row where the GOA circuit is located.

Specifically, a layout model of the fourth thin film transistor NT4 is that, a gate of the fourth thin film transistor NT4 serves as the input terminal and is connected to another first clock signal line XCK, a first electrode of the fourth thin film transistor NT4 serves as the input terminal and is connected to the second level signal line VGL, and a second electrode of the fourth thin film transistor NT4 serves as the output terminal and is connected to the scan line 103 corresponding to the row where the GOA circuit is located.

A first plate C1-1 of the capacitor C1 is connected to the second GOA internal wire 32 (that is, connected between the second thin film transistor NT2 and the third thin film transistor NT3), and a second plate C1-2 is connected to the scan line 103 corresponding to the row where the GOA circuit is located (that is, connected between the third thin film transistor NT3 and the fourth thin film transistor NT4).

Wherein, a phase of a second clock signal provided by the second clock signal line CK is opposite to a phase of a first clock signal provided by the first clock signal lines XCK, and a first level signal provided by the first level signal line VGH is greater than a second level signal provided by the second level signal line VGL.

In a further embodiment, the GOA circuit further includes a voltage stabilizing capacitor C2, a first plate of the voltage stabilizing capacitor C2 is connected to the first GOA internal wire 31, and a second plate is connected to a fixed voltage signal line (not shown in the figure). The fixed voltage signal line is, for example, a common voltage signal line COM, and the common voltage signal line COM provides a stable common voltage. By adding the voltage stabilizing capacitor at the junction of the internal nodes, the node stability of the GOA circuit is improved.

In a further embodiment, the first GOA internal wire 31 and the second GOA internal wire 32 are formed by patterning a same GOA internal wire. For example, multiple GOA internal wires are formed by etching one GOA internal wire.

By applying the above mentioned sequential combination layout model settings to each pixel area, and only adjusting the transmission method of the clock signal, the GOA circuit design can be quickly completed, and the design efficiency is improved.

In a further embodiment, the GOA circuits in odd and even rows are staggered by at least one pixel unit. For example, as shown in the figures, the first thin film transistor NT1 in the GOA circuit in the pixel area of the first row and the first thin film transistor NT1 in the GOA circuit in the pixel area of the second row are staggered by at least one pixel unit in the horizontal direction. Since the pixel areas are driven line by line, the phases of the clock signals received by the pixel areas in adjacent two rows are opposite. For example, simultaneously, the first thin film transistor NT1 in the GOA circuit in the pixel area of the first row receives the second clock signal CK, and the first thin film transistor NT1 in the GOA circuit in the pixel area of the second row receives the first clock signal XCK. At least one pixel unit is staggered by the GOA circuits in odd and even rows, so that the arrangement position of the signal lines transmitting opposite driving signals to the GOA circuit in odd and even rows are staggered, so that only one data line and one driving signal line are provided between the pixel units 111 in two adjacent rows, without setting data lines and two signal lines with opposite driving signals simultaneously, and thus the number of wires can be reduced and layout utilization efficiency can be improved.

The equivalent circuit diagram of the above GOA circuit is shown in FIG. 5. The working principle of the GOA circuit of the present disclosure will be described below with reference to FIGS. 5-6.

The working sequence of the GOA circuit shown in FIG. 5 is mainly divided into the following three stages:

Stage t1: the first clock signal XCK and the initialization signal STV are high level signals (High), and the second clock signal CK is a low level signal (Low). At this time, the first thin film transistor NT1, the second thin film transistor NT2 and the fourth thin film transistor NT4 are turned on. The first thin film transistor NT1 and the second thin film transistor NT2 are turned on, so that a first intermediate node N1 and a second intermediate node N2 receive high level signals, and thus the third thin film transistor NT3 is turned on. The third thin film transistor NT3 and the fourth thin film transistor NT4 are turned on, and thus an output terminal Gn outputs a low level signal.

Stage t2: the second clock signal CK changes to a high level signal, the first clock signal XCK and the initialization signal STV change to low level signals. At this time, the second thin film transistor NT2 maintains on, the first thin film transistor NT1 and the fourth thin film transistor NT4 are turned off, and the first intermediate node N1 remains high level. The third thin film transistor NT3 maintains turned on, and the output terminal Gn outputs a high level signal. Simultaneously, the voltage of the second intermediate node N2 rises due to the coupling of the capacitor C1.

Stage t3: The first clock signal XCK changes to a high level signal, the second clock signal CK changes to a low level signal, and the initialization signal STV maintains a low level signal. At this time, the second thin film transistor NT2 maintains turned on, and the thin film transistor NT1 and the fourth thin film transistor NT4 are turned on, so that the first intermediate node N1 and the second intermediate node N2 receive low level signals, the third thin film transistor NT3 is turned off, and the output terminal Gn outputs a low level signal.

Based on the same inventive concept, the present disclosure also provides a display panel.

Figure 7:
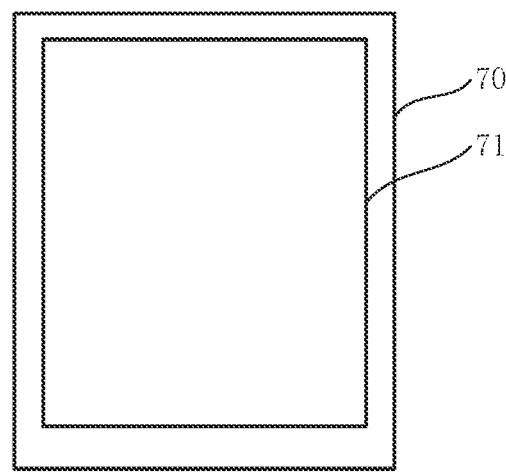
FIG. 7 is a schematic diagram of the display panel architecture of the present disclosure.

Please refer to FIG. 7, which is a schematic diagram of a display panel architecture of the present disclosure. The display panel 70 includes an array substrate 71, and the array substrate 71 applies the array substrate described in the present disclosure.

Using the display panel of the array substrate of the present disclosure, the GOA circuit is designed in the display area, which realizes a design close to bezel-less and improves the product competitiveness. Meanwhile, the GOA circuit is modularly designed, according to the connection states of the three electrodes in the thin film transistors of the GOA circuit, the TFT types are divided into modules to form an independent layout model. The layout of the GOA circuit becomes a sequential combination of the layout models of the corresponding TFTs, which improves the design efficiency.

It can be understood that, for those ordinary skilled in the art, equivalent replacements or changes can be made according to the technical solutions and inventive concepts of the present disclosure, and all such changes or replacements should fall within the protection scope of the claims appended to the present disclosure.

What is claimed is:

1. An array substrate, comprising: a display area; a plurality of scan lines extending in a horizontal direction; and a plurality of data lines extending in a vertical direction, wherein:
   the scan lines and the data lines intersect as an array to define a plurality of pixel areas in the display area, and each of the pixel areas is provided with a pixel unit;
   at least one gate driver on array (GOA) circuit is arranged in the pixel areas of a same row, wherein all GOA circuits of the same row are connected to the same scan line, and each of the GOA circuits of the same row is connected to a driving IC through corresponding driving signal lines extending along the vertical direction to receive a GOA driving signal;
   in the pixel areas of two adjacent rows, the GOA circuit in the pixel area of the first row and the GOA circuit in the pixel area of the second row are staggered by at least one pixel unit in the horizontal direction;
   the GOA circuit comprises a plurality of thin film transistors sequentially arranged in the horizontal direction, and independent layout models are formed according to connection states of three electrodes of the thin film transistors, so that a layout of the GOA circuit is a sequential combination of the layout models of the corresponding thin film transistors; and
   among the electrodes of the thin film transistors an electrode used as an input terminal is connected to the corresponding driving signal line, an electrode used as an output terminal is connected to a corresponding scan line, an electrode used as an intermediate node connected to the other thin film transistors in the same GOA circuit is connected to a corresponding GOA internal wire, and the GOA internal wire extends along the horizontal direction.

2. The array substrate of claim 1, wherein the GOA circuit is located at a gap between the pixel units in two adjacent rows.

3. The array substrate of claim 1, wherein:
   the driving signal lines includes a first clock signal lines, an initialization signal line, a first level signal line, a second clock signal line, and a second level signal line;
   the GOA circuit includes four thin film transistors and a capacitor, and the four thin film transistors are sequentially arranged in the horizontal direction;
   a layout model of the first thin film transistor is that a gate of the first thin film transistor serves as the input terminal and is connected to one of the first clock signal lines, a first electrode of the first thin film transistor serves as the input terminal and is connected to the initialization signal line, and a second electrode of the first thin film transistor serves as the intermediate node and is connected to a first GOA internal wire;
   a layout model of the second thin film transistor is that a gate of the second thin film transistor serves as the input terminal and is connected to the first level signal line, a first electrode of the second thin film transistor serves as the intermediate node and is connected to the first GOA internal wire, and a second electrode of the second thin film transistor also serves as the intermediate node and is connected to a second GOA internal wire;
   a layout model of the third thin film transistor is that a gate of the third thin film transistor serves as the intermediate node and is connected to the second GOA internal wire, a first electrode of the third thin film transistor serves as the input terminal and is connected to the second clock signal line, and a second electrode of the third thin film transistor serves as the output terminal and is connected to a scan line corresponding to a row where the GOA circuit is located;
   a layout model of the fourth thin film transistor is that a gate of the fourth thin film transistor serves as the input terminal and is connected to another of the first clock signal lines, a first electrode of the fourth thin film transistor serves as the input terminal and is connected to the second level signal line, and a second electrode of the fourth thin film transistor serves as the output terminal and is connected to the scan line corresponding to the row where the GOA circuit is located; and a first plate of the capacitor is connected to the second GOA internal wire, and a second plate of the capacitor is connected to the scan line corresponding to the row where the GOA circuit is located.

4. The array substrate of claim 3, wherein the first GOA internal wire and the second GOA internal wire are formed by patterning a same GOA internal wire.

5. The array substrate of claim 3, wherein a phase of a second clock signal provided by the second clock signal line is opposite to a phase of a first clock signal provided by the first clock signal lines, and a first level signal provided by the first level signal line is greater than a second level signal provided by the second level signal line.

6. The array substrate of claim 3, wherein the GOA circuit further comprises a voltage stabilizing capacitor, and a first plate of the voltage stabilizing capacitor is connected to the first GOA internal wire, and a second plate is connected to a fixed voltage signal line.

7. An array substrate, comprising: a display area; a plurality of scan lines extending in a horizontal direction; and a plurality of data lines extending in a vertical direction, wherein:
   the scan lines and the data lines intersect as an array to define a plurality of pixel areas in the display area, and each pixel area is provided with a pixel unit;
   at least one gate driver on array (GOA) circuit is arranged in the pixel area of a same row, wherein all GOA circuits of the same row are connected to the same scan line, and each of the GOA circuits of the same row is connected to a driving IC through corresponding driving signal lines extending along the vertical direction, to receive a GOA driving signal;
   the GOA circuit comprises a plurality of thin film transistors sequentially arranged in the horizontal direction; and
   among the electrodes of the thin film transistors, an electrode used as an input terminal is connected to the corresponding driving signal line, an electrode used as an output terminal is connected to a corresponding scan line, an electrode used as an intermediate node connected to the other thin film transistors in the same GOA circuit is connected to a corresponding GOA internal wire, and the GOA internal wire extends along the horizontal direction.

8. The array substrate of claim 7, wherein the GOA circuit is located at a gap between the pixel units in two adjacent rows.

9. The array substrate of claim 7, wherein, in the pixel areas of two adjacent rows, between the GOA circuit in the pixel area of the first row and the GOA circuit in the pixel area of the second row, at least one pixel unit is staggered in the horizontal direction.

10. The array substrate of claim 7, wherein: independent layout models are formed according to connection states of three electrodes of the thin film transistors, so that a layout of the GOA circuit is a sequential combination of the layout models of the corresponding thin film transistors.

11. The array substrate of claim 10, wherein:
   the driving signal lines includes first clock signal lines, an initialization signal line, a first level signal line, a second clock signal line and a second level signal line;
   the GOA circuit includes four thin film transistors and a capacitor, and the four thin film transistors are sequentially arranged in the horizontal direction;

a layout model of the first thin film transistor is that a gate of the first thin film transistor serves as the input terminal and is connected to one of the first clock signal lines, a first electrode of the first thin film transistor serves as the input terminal and is connected to the initialization signal line, and a second electrode of the first thin film transistor serves as the intermediate node and is connected to a first GOA internal wire;

a layout model of the second thin film transistor is that a gate of the second thin film transistor serves as the input terminal and is connected to the first level signal line, a first electrode of the second thin film transistor serves as the intermediate node and is connected to the first GOA internal wire, and a second electrode of the second thin film transistor serves as the intermediate node and is connected to a second GOA internal wire;

a layout model of the third thin film transistor is that a gate of the third thin film transistor serves as the intermediate node and is connected to the second GOA internal wire, a first electrode of the third thin film transistor serves as the input terminal and is connected to the second clock signal line, and a second electrode of the third thin film transistor serves as the output terminal and is connected to a scan line corresponding to a row where the GOA circuit is located;

a layout model of the fourth thin film transistor is that a gate of the fourth thin film transistor serves as the input terminal and is connected to another of the first clock signal lines, a first electrode of the fourth thin film transistor serves as the input terminal and is connected to the second level signal line, and a second electrode of the fourth thin film transistor serves as the output terminal and is connected to the scan line corresponding to the row where the GOA circuit is located; and a first plate of the capacitor is connected to the second GOA internal wire, and a second plate of the capacitor is connected to the scan line corresponding to the row where the GOA circuit is located.

12. The array substrate of claim 11, wherein the first GOA internal wire and the second GOA internal wire are formed by patterning a same GOA internal wire.

13. The array substrate of claim 11, wherein a phase of a second clock signal provided by the second clock signal line is opposite to a phase of a first clock signal provided by the first clock signal lines, and a first level signal provided by the first level signal line is greater than a second level signal provided by the second level signal line.

14. The array substrate of claim 11, wherein the GOA circuit further comprises a voltage stabilizing capacitor, and a first plate of the voltage stabilizing capacitor is connected to the first GOA internal wire, and a second plate is connected to a fixed voltage signal line.

15. A display panel, comprising an array substrate, wherein: the array substrate comprises a display area and has a plurality of scan lines extending in a horizontal direction and a plurality of data lines extending in a vertical direction;
   the scan lines and the data lines intersect as an array to define a plurality of pixel areas in the display area, and each pixel area is provided with a pixel unit;
   at least one gate driver on array (GOA) circuit is arranged in the pixel area of a same row, wherein all GOA circuits of the same row are connected to the same scan line, and each of the GOA circuits of the same row is connected to a driving IC through corresponding driving signal lines extending along the vertical direction to receive a GOA driving signal;

the GOA circuit comprises a plurality of thin film transistors sequentially arranged in the horizontal direction; and among the electrodes of the thin film transistors an electrode used as an input terminal is connected to the corresponding driving signal line, an electrode used as an output terminal is connected to a corresponding scan line, an electrode used as an intermediate node connected to the other thin film transistors in the same GOA circuit is connected to a corresponding GOA internal wire, and the GOA internal wire extends along the horizontal direction.

16. The display panel of claim 15, wherein the GOA circuit is located at a gap between the pixel units in two adjacent rows.

17. The display panel of claim 15, wherein, in the pixel areas of two adjacent rows, between the GOA circuit in the pixel area of the first row and the GOA circuit in the pixel area of the second row, at least one pixel unit is staggered in the horizontal direction.

18. The display panel of claim 15, wherein: independent layout models are formed according to connection states of three electrodes of the thin film transistors, so that a layout of the GOA circuit is a sequential combination of the layout models of the corresponding thin film transistors.

\* \* \* \* \*